(12) United States Patent
Park et al.

(10) Patent No.: US 8,902,414 B2
(45) Date of Patent: Dec. 2, 2014

(54) METHOD OF MEASURING UNIFORMITY OF EXPOSING LIGHT AND EXPOSURE SYSTEM FOR PERFORMING THE SAME

(71) Applicant: Samsung Display Co., Ltd., Yongin (KR)

(72) Inventors: Jung-In Park, Seoul (KR); Cha-Dong Kim, Hwaseong-si (KR); Su-Yeon Sim, Changwon-si (KR); Sang-Hyun Yun, Suwon-si (KR); Hi-Kuk Lee, Yongin-si (KR)

(73) Assignee: Samsung Display Co., Ltd. (KR)

( * ) Notice: Subject to any disclaimer, the term of this patent is extended or adjusted under 35 U.S.C. 154(b) by 107 days.

(21) Appl. No.: 13/669,751

(22) Filed: Nov. 6, 2012

(65) Prior Publication Data
US 2013/0141714 A1    Jun. 6, 2013

(30) Foreign Application Priority Data
Dec. 6, 2011    (KR) .......................... 10-2011-0129667

(51) Int. Cl.
*G01J 1/00* (2006.01)
*G03F 7/20* (2006.01)

(52) U.S. Cl.
CPC .... *G01J 1/00* (2013.01); *G03F 7/20* (2013.01)
USPC ........................................................ 356/121

(58) Field of Classification Search
USPC .............................. 356/121; 428/195.1; 430/5
See application file for complete search history.

(56) References Cited

U.S. PATENT DOCUMENTS

| | | | | |
|---|---|---|---|---|
| 5,709,970 | A * | 1/1998 | Hashimoto | 430/5 |
| 2002/0067477 | A1 | 6/2002 | Morita et al. | |
| 2008/0241486 | A1 * | 10/2008 | Ishikawa et al. | 428/195.1 |
| 2011/0217635 | A1 * | 9/2011 | Hashimoto et al. | 430/5 |

* cited by examiner

*Primary Examiner* — Tarifur Chowdhury
*Assistant Examiner* — Jamil Ahmed
(74) *Attorney, Agent, or Firm* — Cantor Colburn LLP

(57) ABSTRACT

An exposure system includes an exposure apparatus, a mask, a test pattern portion and a uniformity measuring part. The exposure apparatus includes a first module and a second module. The first and second modules each emit light and are overlapped in an overlapping area. The mask includes a plurality of transmission portions which are spaced apart from each other. Each of the transmission portions has a width less than a width of the overlapping area. The test pattern portion includes a plurality of test patterns which are patterned by using the light transmitted through the transmission portions of the mask. The uniformity measuring part measures a uniformity of the test patterns.

16 Claims, 13 Drawing Sheets

METHOD OF MEASURING UNIFORMITY OF EXPOSING LIGHT AND EXPOSURE SYSTEM FOR PERFORMING THE SAME

This application claims priority to Korean Patent Application No. 10-2011-0129667, filed on Dec. 6, 2011, and all the benefits accruing therefrom under 35 U.S.C. §119, the contents of which are herein incorporated by reference in their entireties.

BACKGROUND OF THE INVENTION

1. Field of the Invention

Exemplary embodiments of the invention relate to a method of measuring a uniformity of an exposing light and an exposure system for performing the method of measuring the uniformity of the exposure. More particularly, exemplary embodiments of the invention relate to a method of measuring a uniformity of an exposing light emitted from an exposure apparatus and an exposure system for performing the method of measuring the uniformity of the exposure.

2. Description of the Related Art

Elements such as a thin-film transistor are formed on a substrate of a display apparatus such as a liquid crystal display apparatus, an electrophoretic display apparatus and micro electro mechanical system ("MEMS") display apparatus. The elements are formed through a photo process, an exposure process, an etching process, a strip process, a cleaning process, etc.

An exposure apparatus processing the exposure process includes a plurality of optical modules respectively emitting a light. However, intensity of illuminance of the light irradiated onto the substrate of the display apparatus from the optical modules is not uniform. Electric characteristics of a fine pattern of the elements formed using the optical modules are deteriorated, and thus an image displayed on the display apparatus may be deteriorated. Thus, a technique of measuring a uniformity of an exposing light by the exposure apparatus is required.

BRIEF SUMMARY OF THE INVENTION

Exemplary embodiments of the invention provide a method of measuring a uniformity of an exposing light by an exposure apparatus.

Exemplary embodiments of the invention also provide an exposure system performing the above-mentioned method of measuring a uniformity of an exposing light.

According to one or more of an exemplary embodiment of the invention, an exposure system includes an exposure apparatus, a mask, a test pattern portion and a uniformity measuring part. The exposure apparatus includes a first module and a second module. The first and second modules overlap in an overlapping area, and each of the first and second modules emit a light. The mask includes a plurality of transmission portions which are spaced apart from each other. Each of the transmission portions has a width less than a width of the overlapping area. The transmission portions transmit the light. The test pattern portion includes a plurality of test patterns which are patterned by using the light transmitted through the transmission portions of the mask. The uniformity measuring part measures a uniformity of the test patterns.

In one or more exemplary embodiment, each of the test patterns may include a metal pattern which is patterned by using the light.

In one or more exemplary embodiment, the uniformity measuring part may include first and second probes which are connected to the metal pattern and measure electrical characteristics of the metal pattern.

In one or more exemplary embodiment, the metal pattern may include first and second conduction portions which face each other in a plan view of the metal pattern, and a concave portion. Facing edges of the first and second conduction patterns form a concave shape in the plan view. The concave portion is at a central portion of the metal pattern and includes the concave shape.

In one or more exemplary embodiment, the concave portion includes two of the concave shapes which face each other, and a distance between the two concave shapes is a width of the concave portion. The metal pattern may include a plurality of the concave portions having widths different from each other.

In one or more exemplary embodiment, the first probe may be connected to the first conduction portion and the second probe may be connected to the second conduction portion, and the connection of the first and second probes to the first and second conduction portions, respectively, test electric connection between the first conduction portion and the second conduction portion.

In one or more exemplary embodiment, the test pattern portion may further include a conduction bar electrically connecting a plurality of the first conduction portions to each other.

In one or more exemplary embodiment, the first probe may be connected to a first terminal of the test pattern and the second probe may be connected to a second terminal of the test pattern, and the connection of the first and second probes to the first and second terminals, respectively, measure a resistance of the test pattern.

In one or more exemplary embodiment, each of the test patterns may include a plurality of bends along a longitudinal axis of the test pattern.

In one or more exemplary embodiment, each of the test patterns may include a photoresist pattern which is patterned by using the light.

In one or more exemplary embodiment, the uniformity measuring part may include a thickness measuring part which measures a thickness of the photoresist pattern.

In one or more exemplary embodiment, each of the transmission portions may include a slit.

In one or more exemplary embodiment, each of the transmission portions may include a half tone film.

In one or more exemplary embodiment, each of the transmission portions may include slits having sizes different from each other.

In one or more exemplary embodiment, the test pattern portion may be at an edge portion of a substrate which is scanned by the exposure apparatus.

According to one or more exemplary embodiment of the invention, there is provided a method of measuring a uniformity of an exposing light. In the method, a mask is disposed under first and second modules which emit a light, and includes a plurality of transmission portions spaced apart from each other. The first and second modules overlap in an overlapping area. The light through the transmission portions is transmitted to form a test pattern portion including a plurality of test patterns. A uniformity of the test patterns is measured. Each of the transmission portions has a width less than a width of the overlapping area.

In one or more exemplary embodiment, each of the test patterns may include a metal pattern which is patterned by using the light. The metal pattern may include first and second conduction portions which face each other in a plan view of the metal pattern, and a concave portion. Facing edges of the first and second conduction patterns form a concave shape in the plan view. The concave portion is at a central portion of the metal pattern and includes the concave shape, and the uniformity of the test patterns may be measured by connecting a first probe to the first conduction portion and a second probe to the second portion to test electrical connection between the first and the second conduction portions.

In one or more exemplary embodiment, each of the test patterns may include a metal pattern which is patterned by using the light. The uniformity of the test patterns may be measured by connecting a first probe to a first terminal of the metal pattern and a second probe to a second terminal of the metal pattern to measure a resistance of the metal pattern.

In one or more exemplary embodiment, each of the test patterns may include a photoresist pattern which is patterned by using the light, and the uniformity of the test patterns may be measured by measuring a thickness of the photoresist pattern.

In one or more embodiment, each of the test patterns includes a photoresist pattern including a photoresist layer which is patterned by using the light, and the uniformity of the test patterns may be measured by measuring a remaining portion of the photoresist layer.

According to the invention, the uniformity of the exposure by an exposure system may be easily measured. Thus the uniformity of the exposure by the exposure apparatus may be easily detected, so that a process performed on a substrate may be stopped to decrease a defect rate of a display panel including the substrate.

BRIEF DESCRIPTION OF THE DRAWINGS

The above and other features and advantages of the invention will become more apparent by describing in detailed exemplary embodiments thereof with reference to the accompanying drawings, in which.

DETAILED DESCRIPTION OF THE INVENTION

Figure 1:
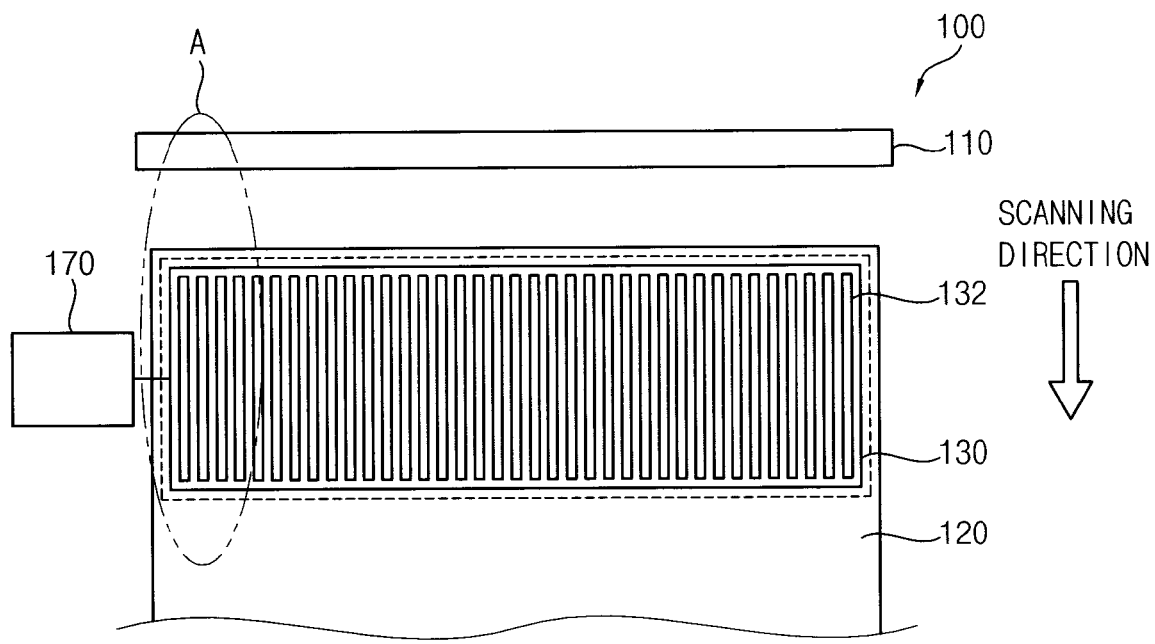
FIG. 1 is a plan view illustrating an exemplary embodiment of an exposure system according to the invention.

It will be understood that when an element or layer is referred to as being "on" or "connected to" another element or layer, the element or layer can be directly on or connected to another element or layer or intervening elements or layers. In contrast, when an element is referred to as being "directly on" or "directly connected to" another element or layer, there are no intervening elements or layers present. As used herein, "connected" includes physically and/or electrically connected. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein. Hereinafter, the invention will be explained in detail with reference to the accompanying drawings.

Figure 2:
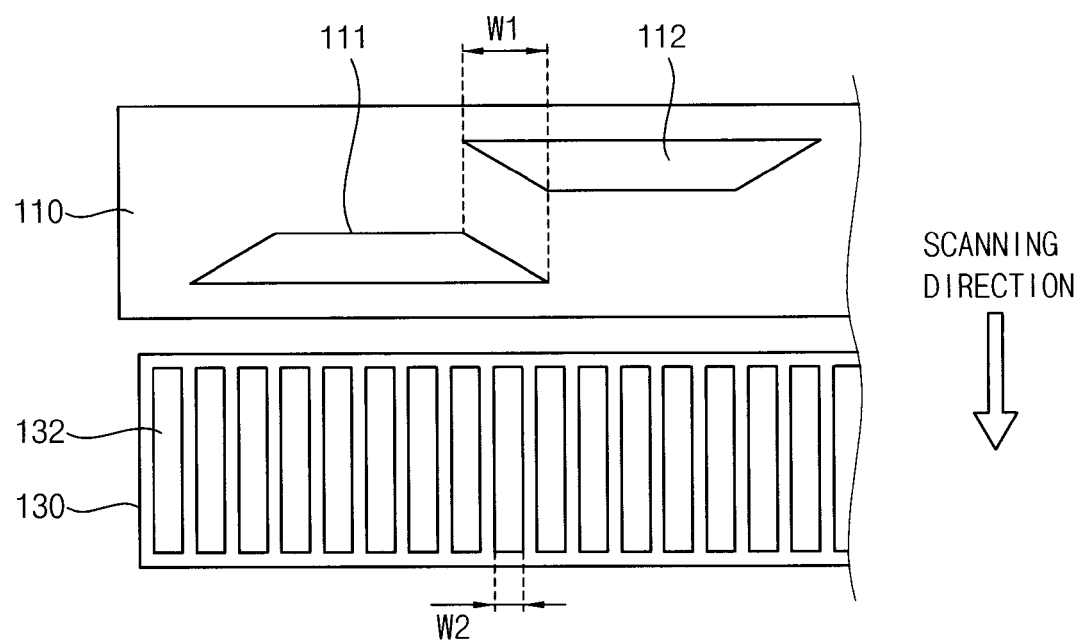
FIG. 2 is an enlarged plan view illustrating portion 'A' of FIG. 1.

FIG. 1 is a plan view illustrating an exemplary embodiment of an exposure system according to the invention, and FIG. 2 is an enlarged plan view illustrating portion 'A' of FIG. 1.

Referring to FIGS. 1 and 2, the exemplary embodiment of the exposure system 100 includes an exposure apparatus 110, a substrate 120, a mask 130 and a uniformity measuring part 170.

The exposure apparatus 110 generates and emits a light on the substrate 120 through the mask 130 to form a test pattern portion 140 (shown in FIG. 3C) on the substrate 120. The exposure apparatus 110 includes a plurality of optical modules 111 and 112. Each of the optical modules 111 and 112 generates and emits the light. Each of the optical modules 111 and 112 may include a light source which generates the light and a plurality of lenses through which the light is emitted. The optical modules 111 and 112 are overlapped in an overlapping area. Thus, the overlapping area in which a first optical module 111 and a second optical module 112 of the optical modules 111 and 112 are overlapped with each other may have a first width W1.

The substrate 120 may be an element of a display panel. In one exemplary embodiment, for example, the substrate 120 may be a base substrate of a thin-film transistor ("TFT") substrate of the display panel, in which a TFT is formed. Alternatively, the substrate 120 may be a base substrate of a color filter substrate of the display panel, in which a color filter is formed. The substrate 120 may include glass, plastic, etc.

The mask 130 is disposed between the exposure apparatus 110 and the substrate 120. The mask 130 includes a light blocking portion blocking the light emitted from the exposure apparatus 110, and transmission portions 132 transmitting the light emitted from the exposure apparatus 110 and spaced apart from each other. The light blocking portion may be remaining portions of the mask 130 except for the transmission portions 132. The light blocking portion may be disposed between the transmission portions 132 spaced apart from each other such that the light blocking portion and the transmission portions 132 alternate. Each of the transmission portions 132 has a second width W2, and the second width W2 is less than the first width W1 of the overlapping area. In one exemplary embodiment, for example, the first width W1 may be about 16.8 millimeters (mm) and the second width W2 may be about 5 mm.

The uniformity measuring part 170 measures a uniformity of the test pattern portion formed on the substrate 120 by the exposure apparatus 110 and the mask 130.

FIGS. 3A to 3D are cross-sectional views illustrating an exemplary embodiment of a method of forming a test pattern portion using the exposure apparatus 110 and the mask 130 of FIG. 1.

Figure 3A:
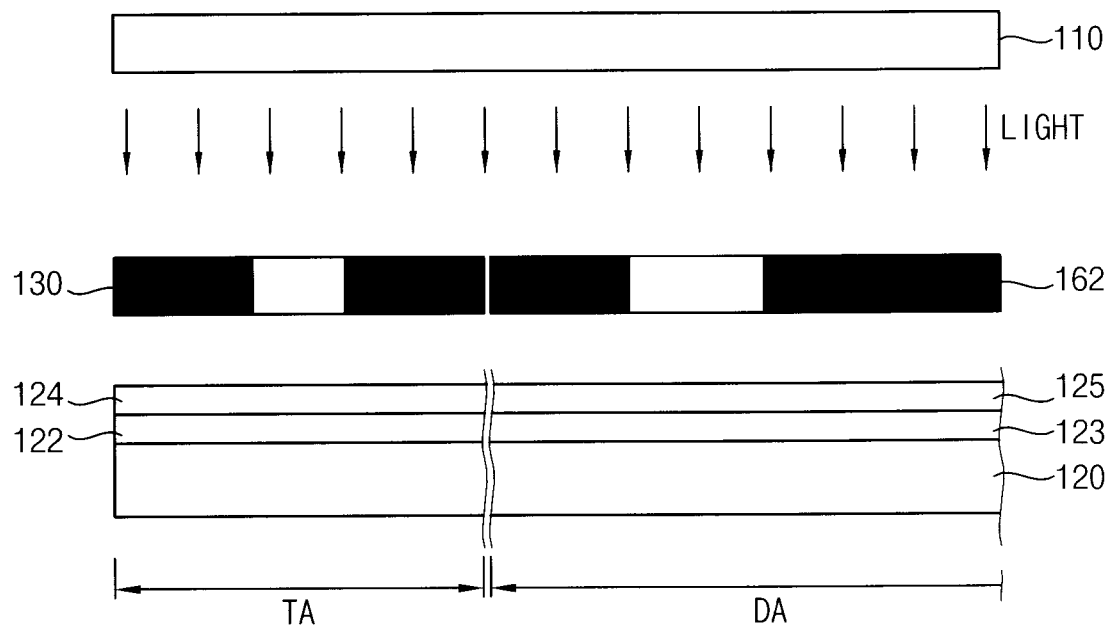
FIGS. 3A to 3D are cross-sectional views illustrating an exemplary embodiment of a method of forming a test pattern portion using the exposure apparatus and the mask of FIG. 1.

Referring to FIG. 3A, the substrate 120 includes a display area DA in which the TFT and a pixel electrode of the display panel are formed to display an image, and a test area TA in which the test pattern portion is formed. In one exemplary embodiment, for example, the test area TA may be an edge portion of the substrate 120.

A first metal layer 122 and a first photoresist layer 124 may be sequentially laminated in the test area TA and on the substrate 120. A second metal layer 123 and a second photoresist layer 125 used in forming a gate electrode of the TFT may be sequentially laminated in the display area DA and on the substrate 120.

The mask 130 is disposed on the test area TA of the substrate 120 and a mask 162 is disposed on the display area DA of the substrate 120.

The exposure apparatus 110 irradiates light onto the substrate 120.

Figure 3B:
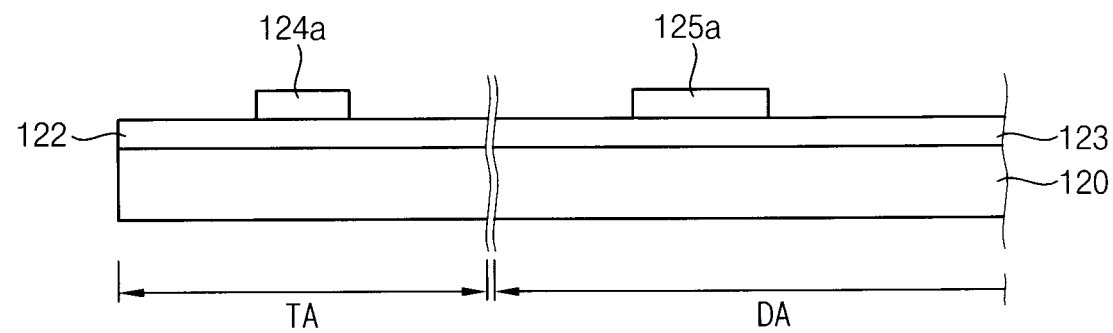

Referring to FIG. 3B, the first photoresist layer 124 is patterned by using the light emitted from the exposure apparatus 110 and passed through the mask 130 to form a first photoresist pattern 124a. In addition, the second photoresist layer 125 is patterned by a light emitted from the exposure apparatus 110 and passed through the mask 162 to form a second photoresist pattern 125a.

Figure 3C:
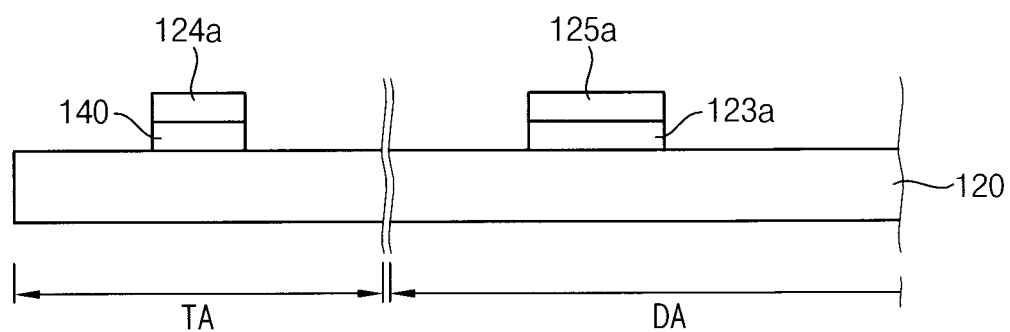

Referring to FIG. 3C, the first metal layer 122 is etched based on the first photoresist pattern 124a in the test area TA to form the test pattern portion 140. The test pattern portion 140 includes a plurality of test patterns spaced apart from each other in a direction substantially perpendicular to a direction in which the test area TA and the display area DA are arranged. The second metal layer 123 is etched based on the second photoresist pattern 125a in the display area DA to form the gate electrode 123a of the TFT.

Figure 3D:
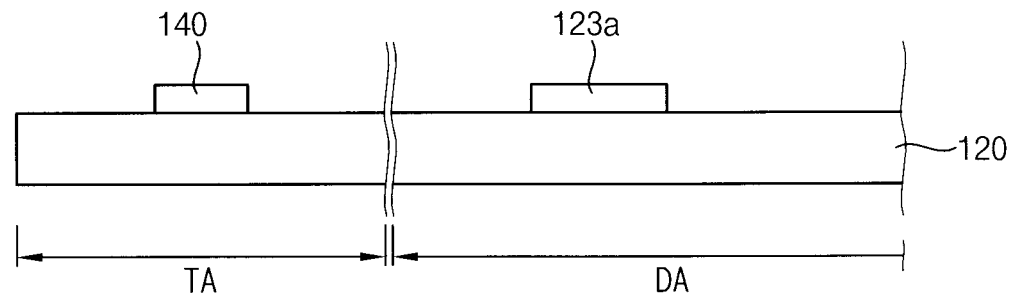

Referring to FIG. 3D, the first photoresist pattern 124a is removed from the test pattern portion 140 in the test area TA. The second photoresist pattern 125a is removed from the gate electrode 123a in the display area DA. A uniformity of the test patterns in the test pattern portion 140 is measured using the uniformity measuring part 170.

Figure 4A:
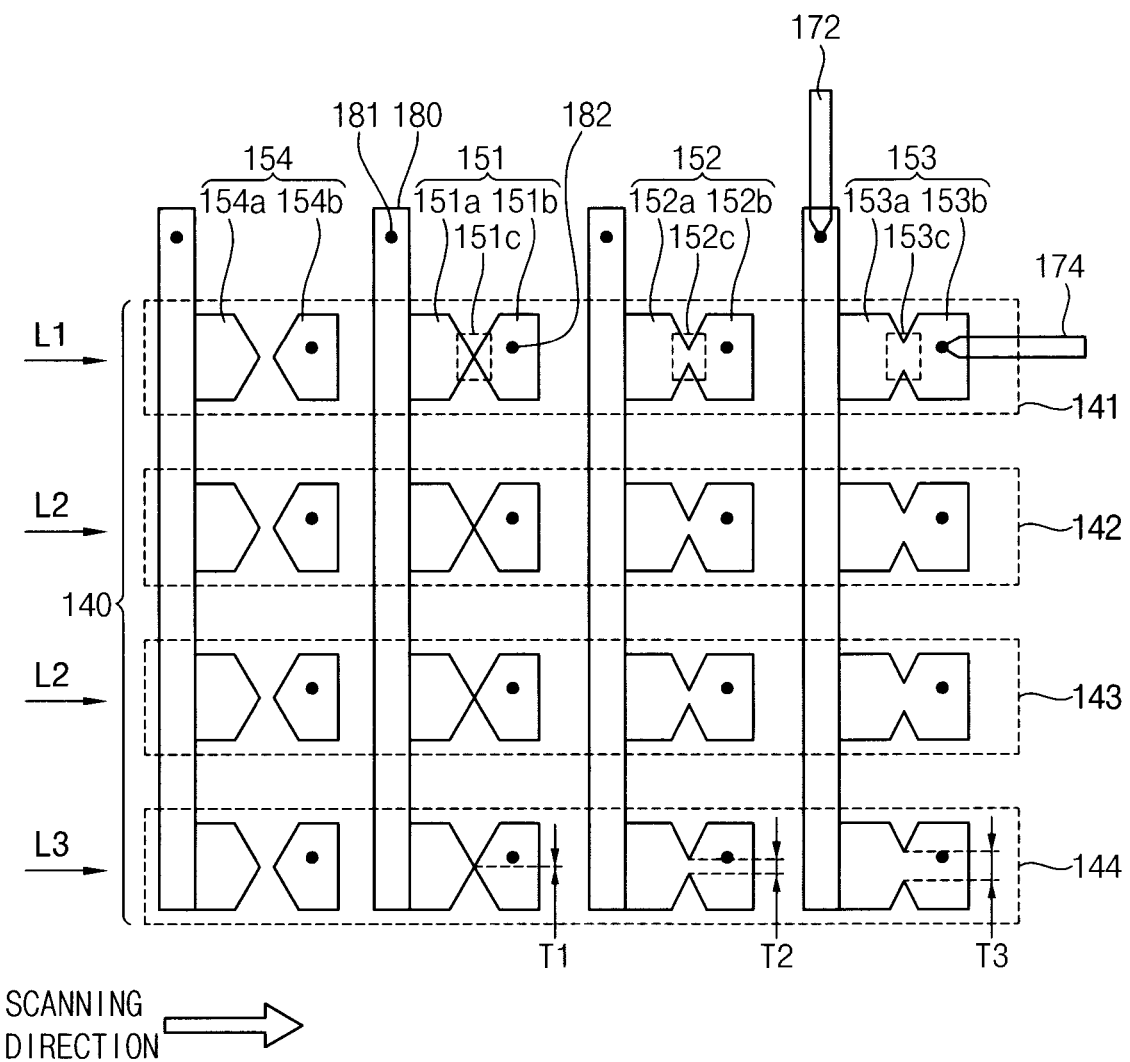
FIGS. 4A and 4B are plan views illustrating the test pattern portion for describing an exemplary embodiment of a method of measuring a uniformity of an exposing light according to the invention.
Figure 4B:
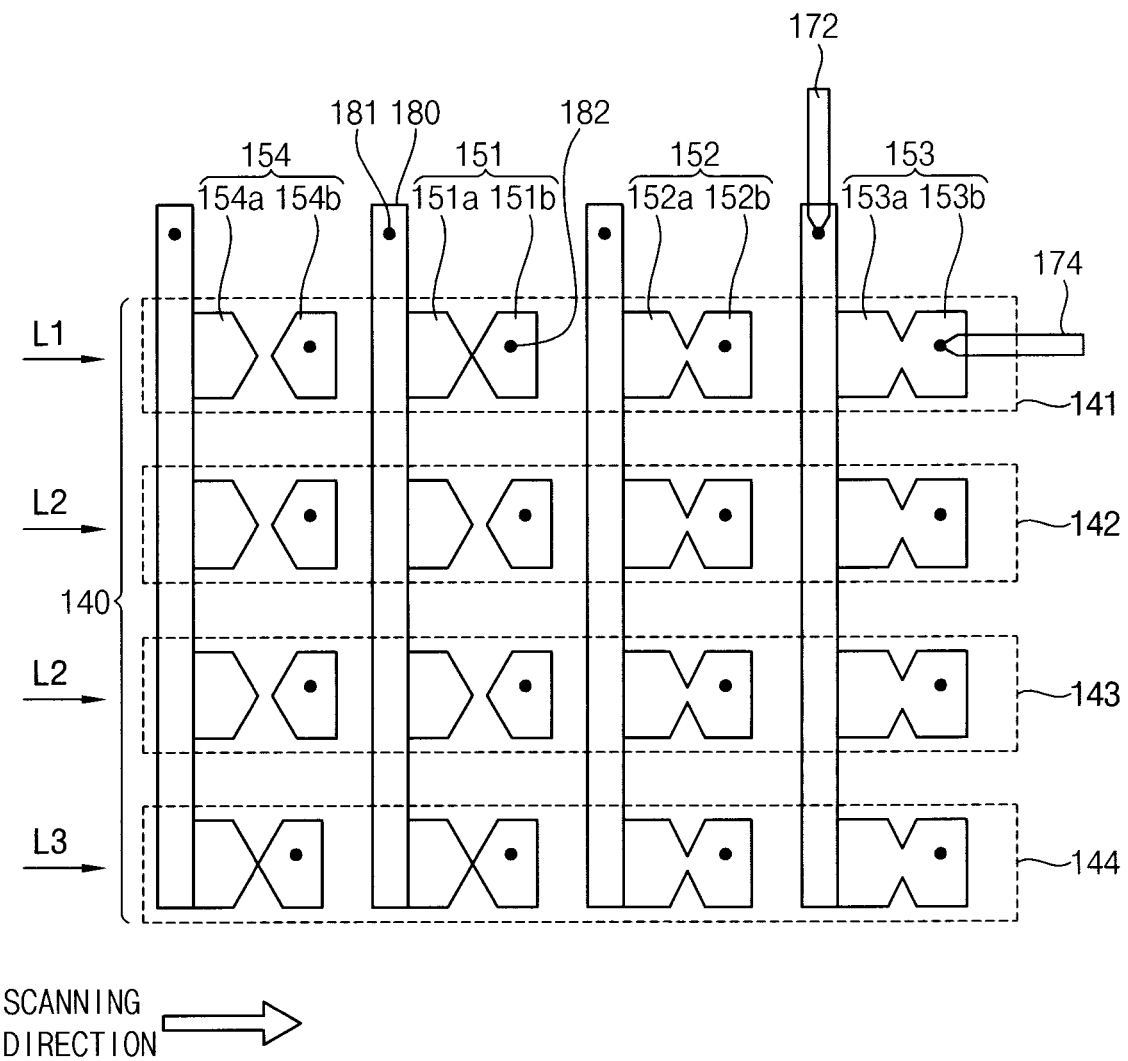

FIGS. 4A and 4B are plan views illustrating the test pattern portion 140 for describing an exemplary embodiment of a method of measuring a uniformity of an exposing light according to the invention.

Referring to FIGS. 4A and 4B, the test pattern portion 140 includes a first test pattern 141, a second test pattern 142, a third test pattern 143 and a fourth test pattern 144.

The first test pattern 141 may be formed by a first light L1 emitted from the first optical module 111 of the exposure apparatus 110. The second and third test patterns 142 and 143 may be formed by a second light L2 emitted from the first and second optical modules 111 and 112. The fourth test pattern 144 may be formed by a third light L3 emitted from the second optical module 112.

When illuminances of the first, second and third lights L1, L2 and L3 are uniform, shapes of the first, second, third and fourth test patterns 141, 142, 143 and 144 are substantially the same, as shown in FIG. 4A.

Thus, each of the first, second, third and fourth test patterns 141, 142, 143 and 144 includes a plurality of concave patterns 151, 152, 153 and 154 spaced apart from each other within the respective first, second, third and fourth test patterns 141, 142, 143 and 144.

The first concave pattern 151 includes a first conduction portion 151a, a second conduction portion 151b, and a first concave portion 151c at a central portion of a planar shape of the first concave pattern 151. The first and second conduction portions 151a and 151b are respectively disposed at opposing sides of the first concave portion 151c. The first concave portion 151c includes two concave shapes facing each other, and the facing concave shapes at the first concave portion 151c define a first width T1 in a direction substantially perpendicular to a scanning direction of the exposure apparatus 110.

A concave shape is formed by the inclined faces of the first conduction portion 151a respectively facing the inclined faces of the second conduction portion 152b. As illustrated in FIG. 4A, for example, a first (upper) concave shape formed by the first and second conduction portions 151a and 151b is pointed downward in the plan view, while a second (lower) concave shape formed by the first and second conduction portions 151a and 151b is pointed upward in the plan view. The two concave shapes face each other with respect to a central line of the planar shape of the first concave pattern 151, where the central line is parallel to the scanning direction of the exposure apparatus. The two concave shapes of the first concave pattern 151 may meet to define the first width T1.

The second concave pattern 152 includes a first conduction portion 152a, a second conduction portion 152b and a second concave portion 152c at a central portion of a planar shape of the second concave pattern 152. The first and second conduction portions 152a and 152b are respectively disposed at opposing sides of the second concave portion 152c. The second concave portion 152c includes two concave shapes facing each other, and the facing concave shapes at the second concave portion 152c define a second width T2 larger than the first width T1 in the direction substantially perpendicular to the scanning direction of the exposure apparatus 110.

The third concave pattern 153 includes a first conduction portion 153a, a second conduction portion 153b and a third concave portion 153c at a central portion of a planar shape of the third concave pattern 153. The first and second conduction portions 153a and 153b are respectively disposed at opposing sides of the third concave portion 153c. The third concave portion 153c includes two concave shapes facing each other, and the two facing concave shapes at the third concave portion 153c define a third width T3 larger than the second width T2 in the direction substantially perpendicular to the scanning direction of the exposure apparatus 110.

The two concave shapes of the second and third concave patterns 152 and 153 face each other with respect to a central line of the planar shape of the second and third concave patterns 152 and 153, respectively, where the central lines are parallel to the scanning direction of the exposure apparatus. The respective two concave shapes of the second and third concave patterns 152 and 153 do not overlap each other to define the second and third widths T2 and T3, respectively.

The fourth concave pattern 154 includes a first conduction portion 154a and a second conduction portion 154b of a planar shape of the fourth concave pattern 154. If the inclined edges of the first and second conduction portions 154a and 154b were extended, the upper and lower concave shapes respectively formed would overlap each other. Since the concave shapes formed by the first conduction portion 154a and the second conduction portion 154b of the fourth concave pattern 154 are overlapped, the first conduction portion 154a and the second conduction portion 154b are spaced apart from each other and there is no concave portion.

Thus, the respective concave shapes of the first, second and third concave portions 151c, 152c and 153c in each of the first, second, third and fourth test patterns 141, 142, 143 and 144 define the same width in the direction substantially perpendicular to the scanning direction of the exposure apparatus 110.

The test pattern portion 140 further includes a conduction bar 180 electrically connected to each of the first conduction portions 151a, 152a, 153a and 154a in each of the first, second, third and fourth test patterns 141, 142, 143 and 144. Thus, a respective one of the conduction bars 180 is electrically connected to an entire of the first conduction portions 151a in the first concave pattern 151, an entire of the first conduction portions 152a in the second concave pattern 152, an entire of the first conduction portions 153a in the third concave pattern 153, and an entire of the first conduction portions 154a in the fourth concave pattern 154. An electric power is applied to the conduction bar 180 and current flows through the conduction bar 180 to each of the first conduction portions 152a in the second concave pattern 152, the first conduction portions 153a in the third concave pattern 153, and the first conduction portions 154a in the first concave pattern 151, respectively.

The conduction bar 180 electrically connected to the first conduction portions 151a, 152a, 153a and 154a includes a first contact point 181 to which a first probe 172 of the uniformity measuring part 170 is connected. Each of the second conduction portions 151b, 152b, 153b and 154b includes a second contact point 182 to which a second probe 174 of the uniformity measuring part 170 is connected.

A current between each of the first conduction portions 151a, 152a, 153a and 154a and each of the second conduction portions 151b, 152b, 153b and 154b of the concave patterns 151, 152, 153 and 154 is measured using the first and second probes 172 and 174 to determine the uniformity the respective planar shapes of the first, second, third and fourth test patterns 141, 142, 143 and 144. When the respective shapes of the first, second, third and fourth test patterns 141, 142, 143 and 144 are substantially the same as indicated by the measured current, the respective illuminances of the first, second and third lights L1, L2 and L3 are confirmed to be uniform.

When the respective illuminances of the first, second and third lights L1, L2 and L3 are not uniform, the respective planar shapes of the first test pattern 141, the second test pattern 142 and the fourth test pattern 144 are not the same as shown in FIG. 4B which is reflected in the measured current.

Referring to FIG. 4B, when the illuminance of the second light L2 is higher than the illuminance of the first light L1, the first conduction portion 151a and the second conduction portion 151b of the first concave pattern 151 in the first test pattern 141 formed by the lower illuminance first light L1 may meet or be connected with each other. However, the first conduction portion 151a and the second conduction portion 151b of the first concave pattern 151 in the second test pattern 142 formed by the higher illuminance second light L2 may be spaced apart from each other.

Thus, since the first conduction portion 151a and the second conduction portion 151b of the first concave pattern 151 in the first test pattern 141 are connected to each other, current may flow. However, since the first conduction portion 151a and the second conduction portion 151b of the first concave pattern 151 in the second test pattern 142 are not connected to each other, current may not flow.

Thus, the uniformity of the first light L1 and the second light L2 may be measured by respectively connecting the first probe 172 and the second probe 174 to the first contact point 181 and the second contact point 182. In detail, a current between the first conduction portion 151a and the second conduction portion 151b in the first test pattern 141 and a current between the first conduction portion 151a and the second conduction portion 151b in the second test pattern 142 are measured using the first and second probes 172 and 174. Since the two currents are different for the first concave pattern 151 in the first test pattern 141 and for first concave pattern 151 the second test pattern 142, the uniformity of the first light L1 and the second light L2 may be measured.

When the illuminance of the third light L3 is less than the illuminance of the first light L1, the first conduction portion 154a and the second conduction portion 154b of the fourth concave pattern 154 in the first test pattern 141 formed by the higher illuminance first light L1 may be spaced apart from each other. However, the first conduction portion 154a and the second conduction portion 154b of the fourth concave pattern 154 in the fourth test pattern 144 formed by the lower illuminance third light L3 may be connected with each other.

Thus, since the first conduction portion 154a and the second conduction portion 154b of the fourth concave pattern 154 in the first test pattern 141 are not connected to each other, current may not flow. However, since the first conduction portion 154a and the second conduction portion 154b of the fourth concave pattern 154 in the fourth test pattern 144 are connected to each other, current may flow.

Thus, the uniformity of the first light L1 and the third light L3 may be measured by respectively connecting the first probe 172 and the second probe 174 to the first contact point 181 and the second contact point 182. In detail, a current between the first conduction portion 154a and the second conduction portion 1541b in the first test pattern 141 and a current between the first conduction portion 154a and the second conduction portion 154b in the fourth test pattern 144 are measured using the first and second probes 172 and 174. Since the two currents are different for the fourth concave pattern 154 in the first test pattern 141 and for fourth concave pattern 154 the fourth test pattern 144, the uniformity of the first light L1 and the third light L3 may be measured.

In one or more exemplary embodiment, the uniformity of the exposure by the exposure apparatus 110 may be measured by connecting the first probe 172 and the second probe 174 to the first, second, third and fourth test patterns 141, 142, 143 and 144 to measure the current which flows therethrough. Thus, when the uniformity of the exposure by the exposure apparatus 110 is less than a predetermined reference, a process performed with respect to the substrate 120 may be stopped to decrease a defect rate of a display panel including the substrate 120.

Figure 5:
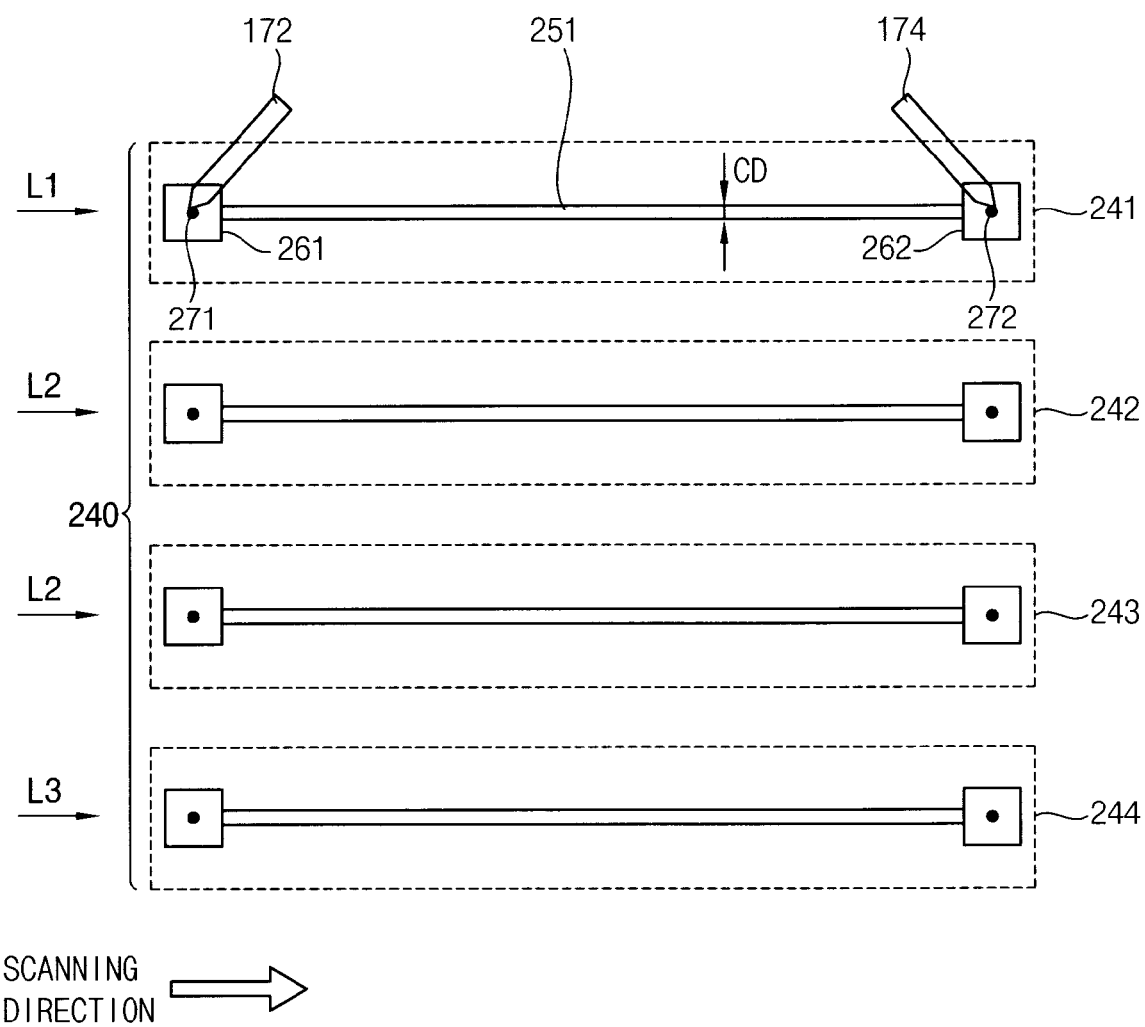
FIG. 5 is a plan view illustrating another exemplary embodiment of a test pattern portion according to the invention.

FIG. 5 is a plan view illustrating another exemplary embodiment of a test pattern portion according to the invention.

The exemplary embodiment of the test pattern portion 240 may be formed by the exposure apparatus 110 and the mask 130 according to the previous exemplary embodiment illustrated in FIG. 1. Thus, the same reference numerals will be used to refer to same or like parts as those described in the previous exemplary embodiment and any further repetitive explanation concerning the above elements will be omitted.

Referring to FIG. 5, the test pattern portion 240 includes a first test pattern 241, a second test pattern 242, a third test pattern 243 and a fourth test pattern 244.

Specifically, each of the first test pattern 241, the second test pattern 242, the third test pattern 243 and the fourth test pattern 244 may be formed by patterning the first photoresist 124 by using the light emitted from the exposure apparatus 110 to form the first photoresist pattern 124a and by etching the first metal layer 122 based on the first photoresist pattern 124a, in the test area TA of the substrate 120.

Each of the first, second, third and fourth test patterns 241, 242, 243 and 244 includes a resistor pattern 251, a first contact point portion 261 and a second contact point portion 262.

The resistor pattern 251 has an electrical resistance, the first contact point portion 261 includes a first contact point 271 and is at a first terminal of the resistor pattern 251, and the second contact point portion 262 includes a second contact point 272 and is at a second terminal of the resistor pattern 251. The first and second terminals may be at opposing ends of the resistor pattern 251, but the exemplary embodiment is not limited thereto.

The first test pattern 241 may be formed by the first light L1 emitted from the first optical module 111 of the exposure apparatus 110, the second and third test patterns 242 and 243 may be formed by the second light L2 emitted from the first and second optical modules 111 and 112, and the fourth test pattern 244 may be formed by the third light L3 emitted from the second optical module 112.

When the illuminances of the first, second and third lights L1, L2 and L3 are uniform, the resistor patterns 251 of the first, second, third and fourth test patterns 241, 242, 243 and 244 have uniform critical dimensions CD, and thus the respective resistances of the resistor patterns 251 are substantially the same.

When the illuminances of the first, second and third lights L1, L2 and L3 are not uniform, the resistor patterns 251 of the first, second, third and fourth test patterns 241, 242, 243 and 244 may have the critical dimensions CD different from each other, and thus the respective resistances of the resistor patterns 251 may be different from each other.

Thus, the uniformity of the exposure by the exposure apparatus 110 may be measured by respectively connecting the first probe 172 and the second probe 174 to the first contact point 271 and the second contact point 272, respectively, to measure the respective resistances of the resistor patterns 251 in the first, second, third and fourth test patterns 241, 242, 243 and 244.

In one or more exemplary embodiment, the uniformity of the exposure by the exposure apparatus 110 may be easily and simply measured by connecting the first probe 172 and the second probe 174 to the first, second, third and fourth test patterns 241, 242, 243 and 244 to measure the resistances thereof.

Figure 6:
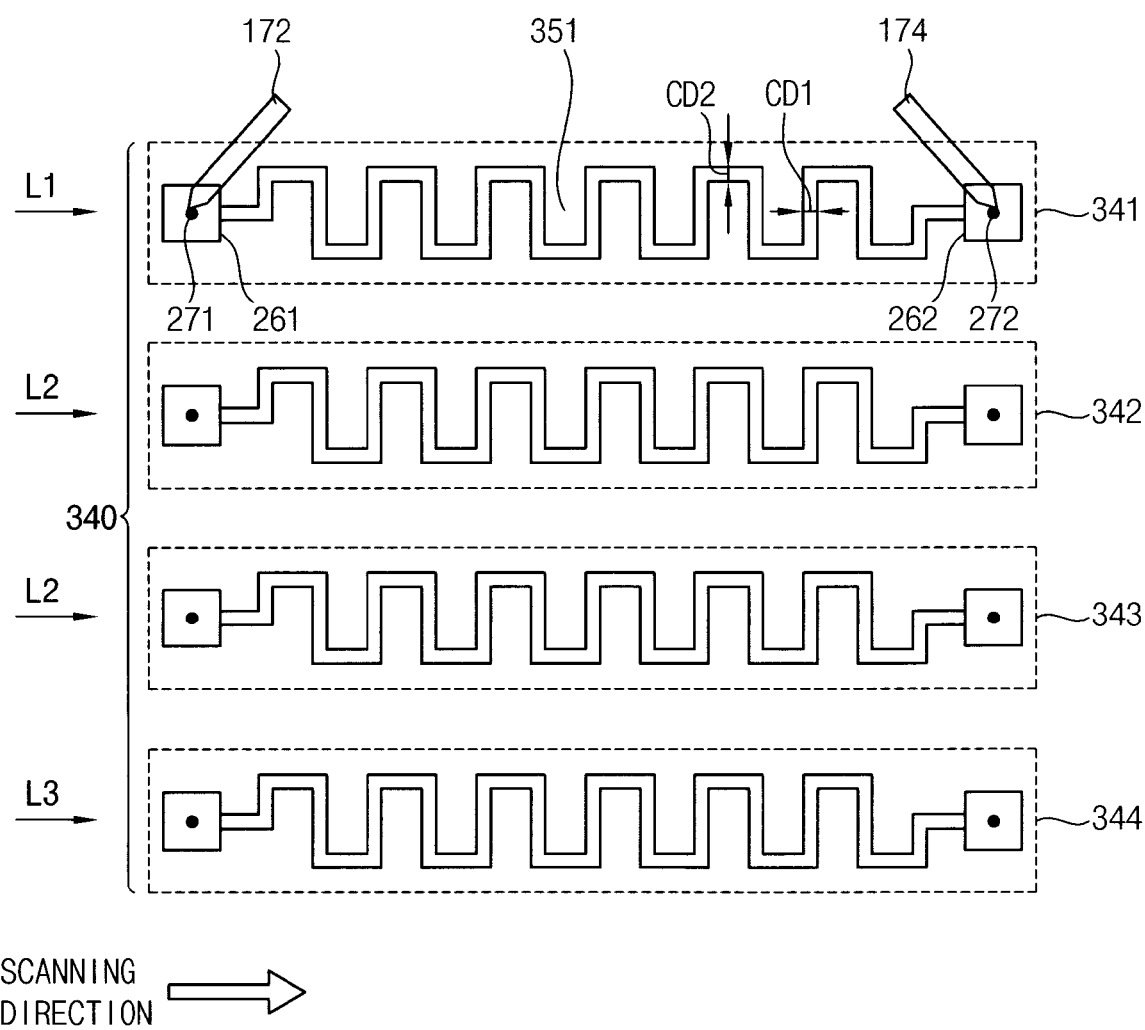
FIG. 6 is a plan view illustrating still another exemplary embodiment of a test pattern portion according to the invention.

FIG. 6 is a plan view illustrating still another exemplary embodiment of a test pattern portion according to the invention.

The exemplary embodiment of the test pattern portion 340 may be formed by the exposure apparatus 110 and the mask 130 according to the previous exemplary embodiment illustrated in FIG. 1, and the exemplary embodiment of the test pattern portion 340 is substantially the same as the exemplary embodiment of the test pattern portion 240 illustrated in FIG. 5 except for the resistor pattern 251. Thus, the same reference numerals will be used to refer to same or like parts as those described in the previous exemplary embodiment and any further repetitive explanation concerning the above elements will be omitted.

Referring to FIG. 6, the test pattern portion 340 includes a first test pattern 341, a second test pattern 342, a third test pattern 343 and a fourth test pattern 344.

Specifically, each of first, second, third and fourth test patterns 341, 342, 343 and 344 may be formed by patterning the first photoresist 124 by using the light emitted from the exposure apparatus 110 to form the first photoresist pattern 124a and by etching the first metal layer 122 based on the first photoresist pattern 124a, in the test area TA of the substrate 120.

Each of the first, second, third and fourth test patterns 341, 342, 343 and 344 includes a resistor pattern 351, the first contact point portion 261 and the second contact point portion 262.

The resistor pattern 351 is bent multiple times along a longitudinal axis of the resistor pattern 351 to have what is referred to as a bent shape, and has an electrical resistance. Thus, the resistor pattern 351 has a first critical dimension CD1 in a horizontal direction of the plan view and parallel to the longitudinal axis, and a second critical dimension CD2 in a vertical direction of the plan view and substantially perpendicular to the horizontal direction. The first contact point portion 261 includes the first contact point 271 and is at a first terminal of the resistor pattern 351, and the second contact point portion 262 includes the second contact point 272 and is at a second terminal of the resistor pattern 351.

The first test pattern 341 may be formed by the first light L1 emitted from the first optical module 111 of the exposure apparatus 110, the second and third test patterns 342 and 343 may be formed by the second light L2 emitted from the first and second optical modules 111 and 112, and the fourth test pattern 344 may be formed by the third light L3 emitted from the second optical module 112.

When the illuminances of the first, second and third lights L1, L2 and L3 are uniform, the resistor patterns 351 of the first, second, third and fourth test patterns 341, 342, 343 and 344 have uniform first and second critical dimensions CD1 and CD2, and thus the respective resistances of the resistor patterns 351 are substantially the same.

When the illuminances of the first, second and third lights L1, L2 and L3 are not uniform, the resistor patterns 351 of the first, second, third and fourth test patterns 341, 342, 343 and 344 may have the first and second critical dimensions CD1 and CD2 different from each other, and thus the respective resistances of the resistor patterns 351 may be different from each other.

Thus, the uniformity of the exposure by the exposure apparatus 110 may be measured by respectively connecting the first probe 172 and the second probe 174 to the first contact point 271 and the second contact point 272 to measure the respective resistances of the resistor patterns 351 in the first, second, third and fourth test patterns 341, 342, 343 and 344.

In one or more exemplary embodiment, the test pattern portion 340 includes the first, second, third and fourth test patterns 341, 342, 343 and 344 having the first critical dimension CD1 in the horizontal direction and the second critical dimension CD2 in the vertical direction, and thus the uniformity of the exposure by the exposure apparatus 110 may be measured more precisely compared to the previous exemplary embodiment of the test pattern portion 240 illustrated in FIG. 5.

Figure 7:
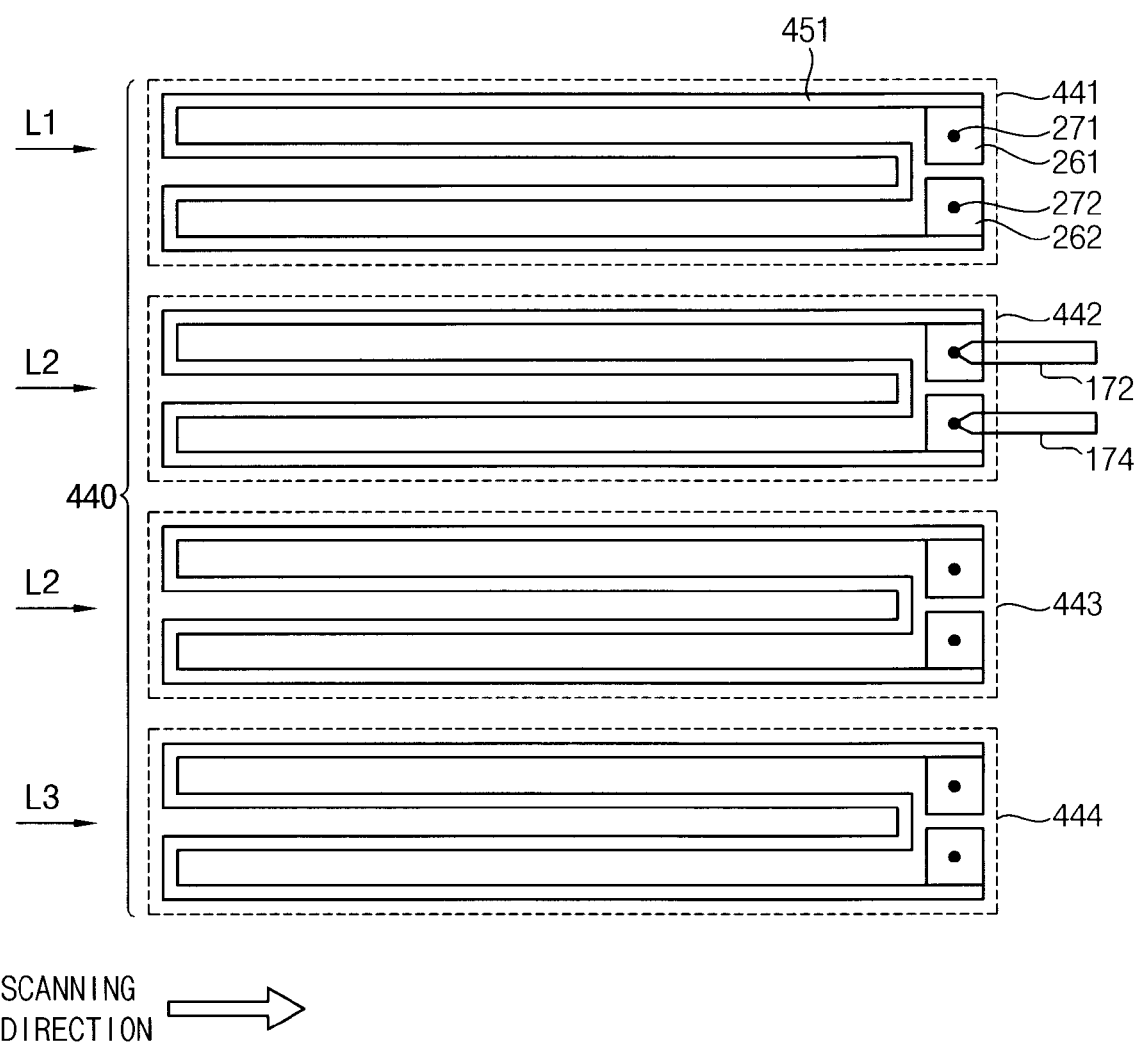
FIG. 7 is a plan view illustrating further still another exemplary embodiment of a test pattern portion according to the invention.

FIG. 7 is a plan view illustrating further still another exemplary embodiment of a test pattern portion according to the invention.

The exemplary embodiment of the test pattern portion 440 may be formed by the exposure apparatus 110 and the mask 130 according to the previous exemplary embodiment illustrated in FIG. 1, and the exemplary embodiment of the test pattern portion 340 is substantially the same as the exemplary embodiment of the test pattern portion 240 illustrated in FIG. 5 except for the resistor pattern 251. Thus, the same reference numerals will be used to refer to same or like parts as those described in the previous exemplary embodiment and any further repetitive explanation concerning the above elements will be omitted.

Referring to FIG. 7, the test pattern portion 440 includes a first test pattern 441, a second test pattern 442, a third test pattern 443 and a fourth test pattern 444.

Specifically, each of first, second, third and fourth test patterns 441, 442, 443 and 444 may be formed by patterning the first photoresist 124 by using the light emitted from the exposure apparatus 110 to form the first photoresist pattern 124a and by etching the first metal layer 122 based on the first photoresist pattern 124a, in the test area TA of the substrate 120.

Each of the first, second, third and fourth test patterns 441, 442, 443 and 444 includes a resistor pattern 451, the first contact point portion 261 and the second contact point portion 262.

The resistor pattern 451 is bent multiple times along a longitudinal axis of the resistor pattern 451 to have what is otherwise referred to as a bent shape, and has an electrical resistance. In addition, the resistor pattern 451 is longer than the resistor pattern 251 of FIG. 5. Thus, the resistance of the exemplary embodiment of the resistor pattern 451 of FIG. 7 may vary more compared to the resistance of the resistor pattern 251 in FIG. 5.

The first contact point portion 261 includes the first contact point 271 and is at a first terminal of the resistor pattern 451, and the second contact point portion 262 includes the second contact point 272 and is at a second terminal of the resistor pattern 451.

The first test pattern 441 may be formed by the first light L1 emitted from the first optical module 111 of the exposure apparatus 110, the second and third test patterns 442 and 443 may be formed by the second light L2 emitted from the first and second optical modules 111 and 112, and the fourth test pattern 444 may be formed by the third light L3 emitted from the second optical module 112.

When the illuminances of the first, second and third lights L1, L2 and L3 are uniform, the resistor patterns 451 of the first, second, third and fourth test patterns 441, 442, 443 and 444 have the same resistances.

When the illuminances of the first, second and third lights L1, L2 and L3 are not uniform, the resistor patterns 451 of the first, second, third and fourth test patterns 441, 442, 443 and 444 may have resistances different from each other.

Thus, the uniformity of the exposure by the exposure apparatus 110 may be measured by respectively connecting the first probe 172 and the second probe 174 to the first contact point 271 and the second contact point 272 to measure the respective resistances of the resistor patterns 451 in the first, second, third and fourth test patterns 441, 442, 443 and 444.

In one or more exemplary embodiment, the test pattern portion 440 includes the first, second, third and fourth test patterns 441, 442, 443 and 444 including the resistor pattern 451 longer than the resistor pattern 251 of FIG. 5, and thus the uniformity of the exposure by the exposure apparatus 110 may be measured more precisely compared to the previous exemplary embodiment of the test pattern portion 240 illustrated in FIG. 5.

Figure 8A:
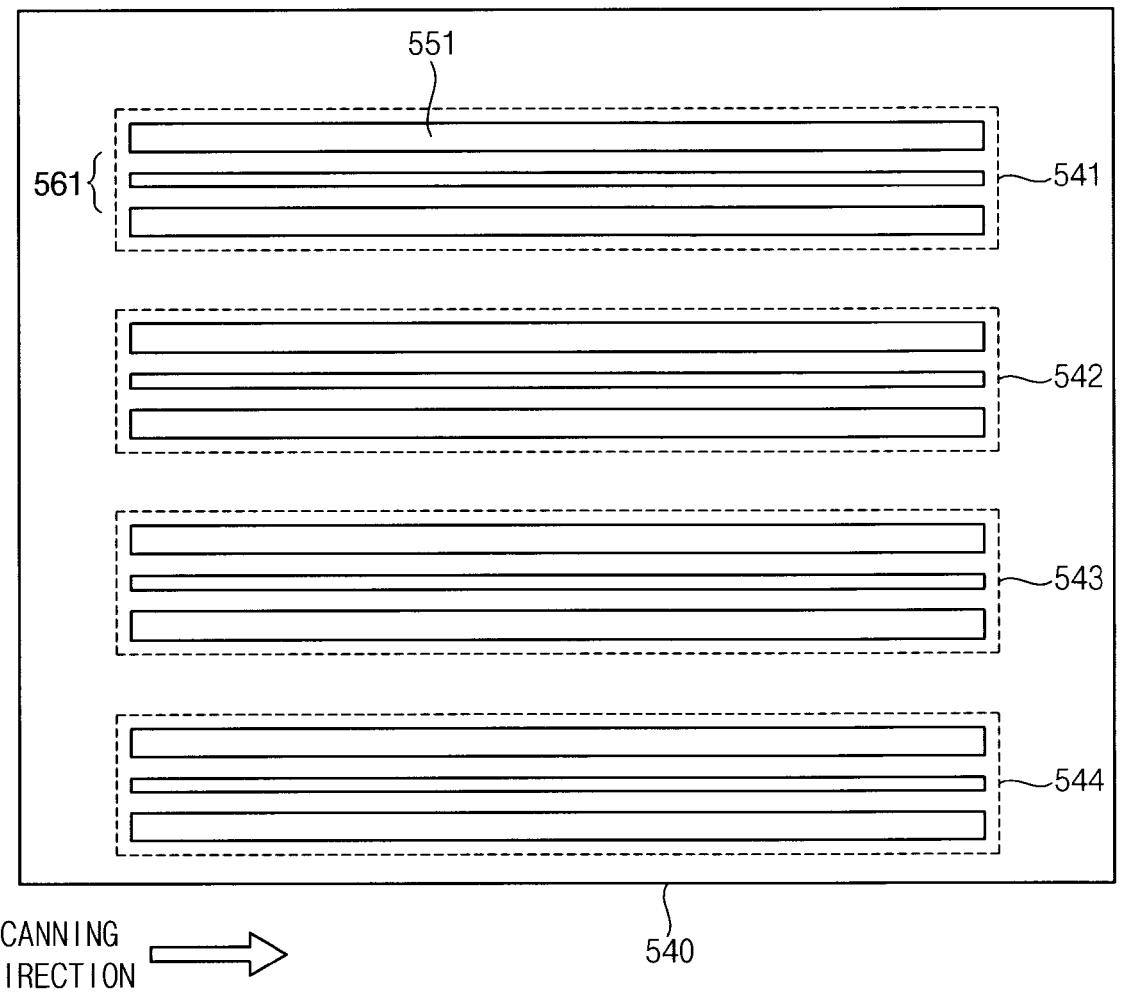
FIG. 8A is a plan view illustrating another exemplary embodiment of a mask according to the invention.
Figure 8B:
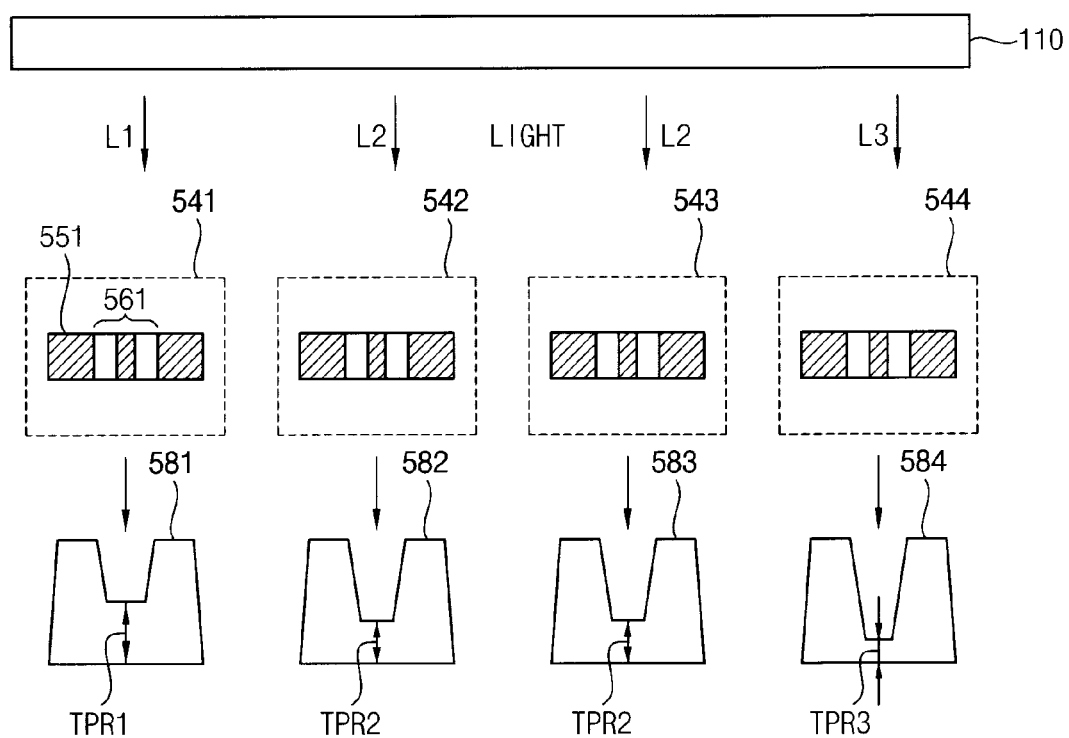
FIG. 8B is a cross-sectional view illustrating a photoresist pattern for describing an exemplary embodiment of a method of measuring a uniformity of an exposing light using the mask in FIG. 8A.

FIG. 8A is a plan view illustrating another exemplary embodiment of a mask according to the invention, and FIG. 8B is a cross-sectional view illustrating a photoresist pattern for describing an exemplary embodiment of a method of measuring a uniformity of an exposing light using the mask 540 in FIG. 8A.

The exemplary embodiment of the mask 540 may be included in the previous exemplary embodiment of the exposure system 100 illustrated in FIG. 1, and the exposure system including the exemplary embodiment of the mask 540 is substantially the same as the exposure system 100 illustrated in FIG. 1 except for the mask 540. Thus, the same reference numerals will be used to refer to same or like parts as those described in the previous exemplary embodiment and any further repetitive explanation concerning the above elements will be omitted.

Referring to FIGS. 8A and 8B, the exemplary embodiment of the mask 540 includes a first mask portion 541, a second mask portion 542, a third mask portion 543 and a fourth mask portion 544. Each of the first, second, third and fourth mask portions 541, 542, 543 and 544 includes a light blocking portion 551 and a transmission portion 561. The transmission portion 561 includes a slit pattern. The slit pattern may include one or more slits or openings in the mask 540 which extend completely through a thickness of the mask 540, in combination with one or more areas of the light blocking portion 551. The first, second, third and fourth mask portions 541, 542, 543 and 544 are substantially the same.

The first light L1 emitted from the first optical module 111 of the exposure apparatus 110 is transmitted through the first mask portion 541 to form a first photoresist pattern 581. The second light L2 emitted from the first and second optical modules 111 and 112 of the exposure apparatus 110 is transmitted through the second and third mask portions 542 and 543 to form second and third photoresist patterns 582 and 583, and the third L3 emitted from the second optical module 112 of the exposure apparatus 110 is transmitted through the fourth mask portion 544 to form a fourth photoresist pattern 584. The first, second, third and fourth photoresist patterns 581, 582, 583 and 584 may be test patterns in a test are TA of a substrate 120 of a display panel for measuring the uniformity of the exposure by the exposure apparatus 110.

Specifically, each of the first, second, third and fourth photoresist patterns 581, 582, 583 and 584 may be formed by patterning a photoresist by using the light emitted from the exposure apparatus 110.

When the illuminances of the first, second and third lights L1, L2 and L3 are uniform, a first thickness TPR1 which is a distance between a recess and a bottom surface of the first photoresist pattern 581, a second thickness TPR2 which is a distance between a recess and a bottom surface of the second and third photoresist patterns 582 and 583 and a third thickness TPR3 which is a distance between a recess and a bottom surface of the fourth photoresist pattern 584, are substantially the same.

However, when the illuminance of the second light L2 is higher than the illuminance of the first light L1 and the illuminance of the third light L3 is higher than the illuminance of the second light L2, the second thickness TPR2 of the second and third photoresist patterns 582 and 583 may be thinner than the first thickness TPR1 of the first photoresist pattern 581, and the third thickness TPR3 of the fourth photoresist pattern 584 may be thinner than the second thickness TPR2 of the second and third photoresist patterns 582 and 583, as illustrated in FIG. 8B.

The uniformity measuring part 170 may include a thickness measuring part measuring the first, second and third thicknesses TPR1, TPR2 and TPR3 of the first, second, third and fourth photoresist patterns 581, 582, 583 and 584. In one exemplary embodiment, for example, the thickness measuring part may include a surface bend analysis apparatus.

According to one or more exemplary embodiment, the uniformity of the exposure by the exposure apparatus 110 may be measured by measuring a thickness of the first, second, third and fourth photoresist patterns 581, 582, 583 and 584 formed by the first, second and third lights L1, L2 and L3 emitted from the exposure apparatus 110. Thus, when the uniformity of the exposure by the exposure apparatus 110 is less than a predetermined reference, a process performed on the substrate 120 may be stopped to decrease a defect rate of a display panel including the substrate 120.

Figure 9:
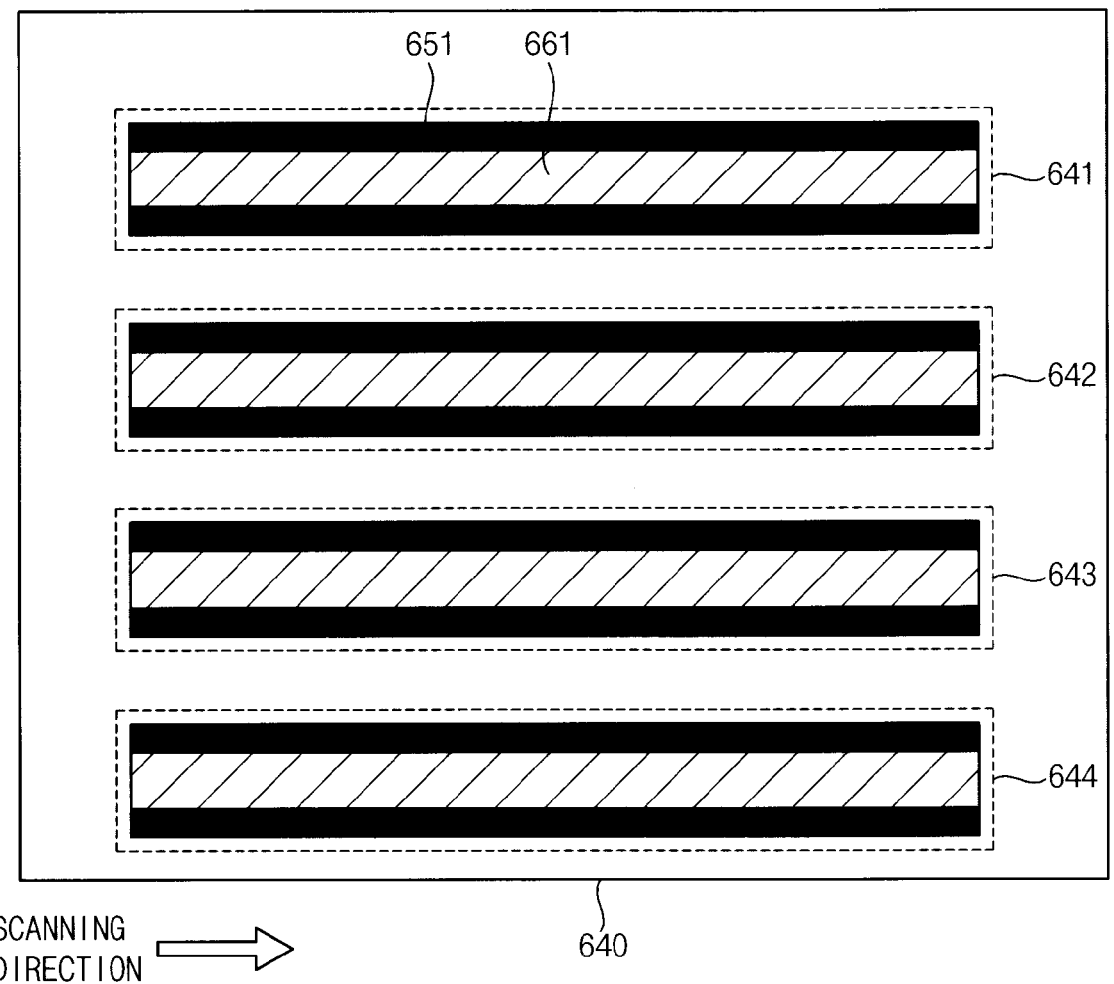
FIG. 9 is a plan view illustrating still another exemplary embodiment of a mask according to the invention.

FIG. 9 is a plan view illustrating still another exemplary embodiment of a mask according to the invention.

The exemplary embodiment of the mask 640 may be included in the previous exemplary embodiment of the exposure system 100 illustrated in FIG. 1, and the exposure system including the exemplary embodiment of the mask 640 is substantially the same as the exposure system 100 illustrated in FIG. 1 except for the mask 640. Thus, the same reference numerals will be used to refer to same or like parts as those described in the previous exemplary embodiment and any further repetitive explanation concerning the above elements will be omitted.

Referring to FIG. 9, the exemplary embodiment of the mask 640 includes a first mask portion 641, a second mask portion 642, a third mask portion 643 and a fourth mask portion 644. Each of the first, second, third and fourth mask portions 641, 642, 643 and 644 includes a light blocking portion 651 and a transmission portion 661, and the transmission portion 661 includes a half tone film.

In one or more exemplary embodiment, each of the first, second, third and fourth masks 641, 642, 643 and 644 includes the transmission portion 661 having the half tone film, and thus a process of manufacturing the mask 640 is simplified compared to a mask having a slit.

Figure 10A:
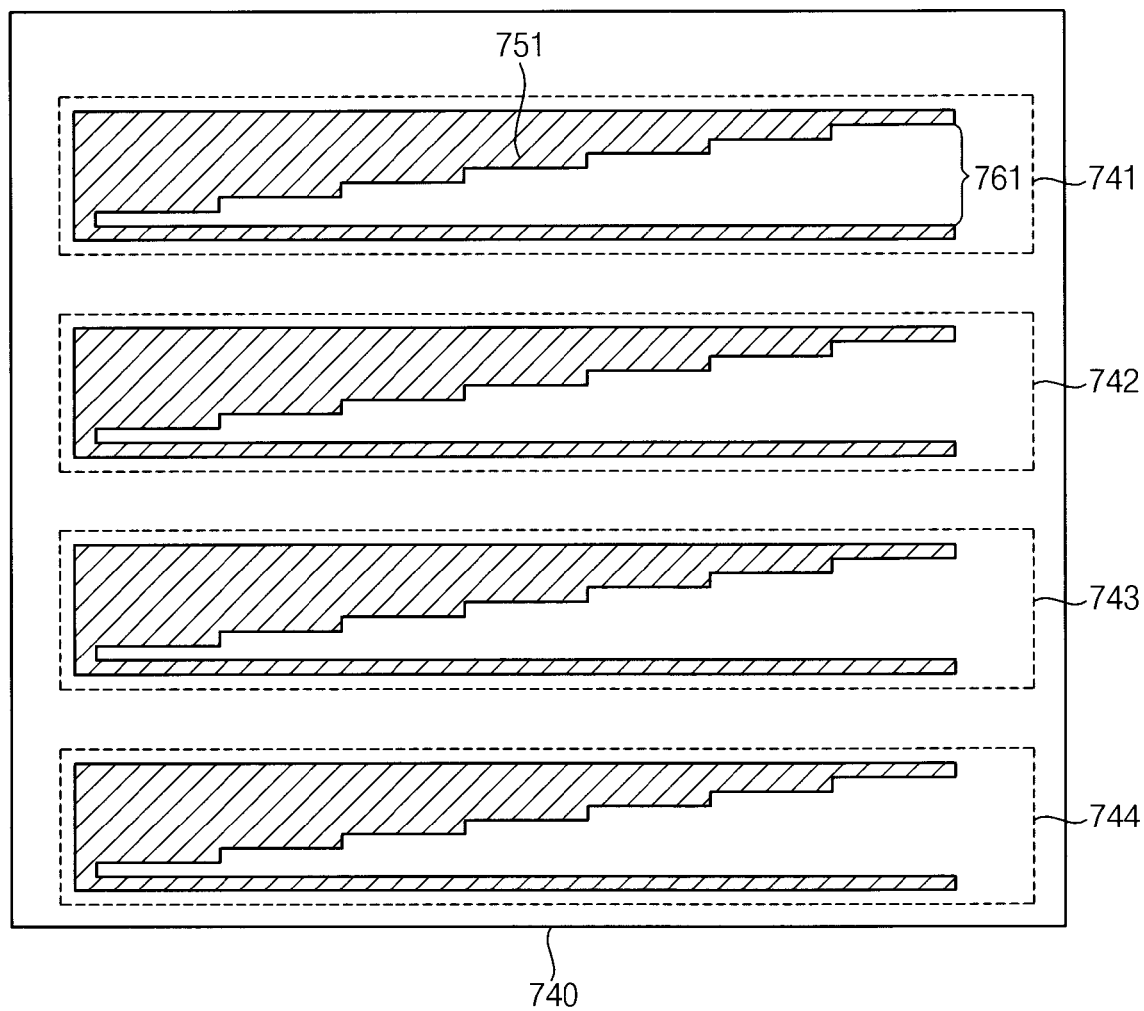
FIG. 10A is a plan view illustrating further still another exemplary embodiment of a mask according to the invention.
Figure 10B:
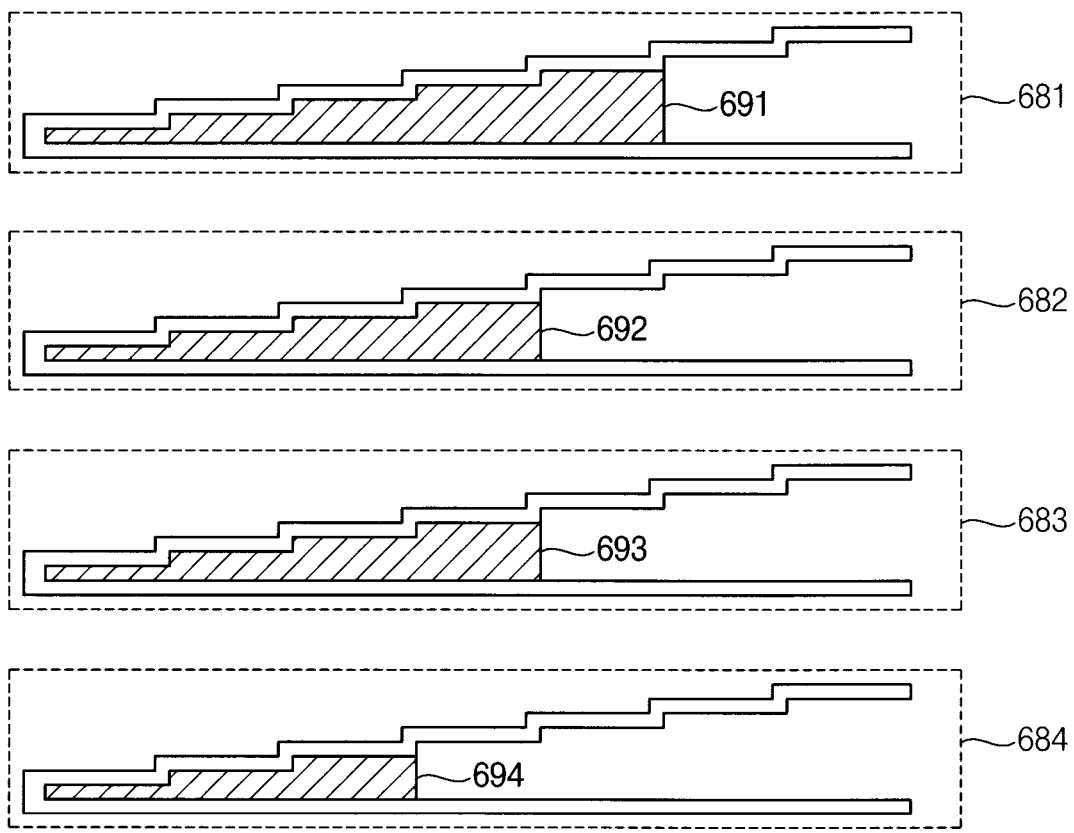
FIG. 10B is a plan view illustrating photoresist patterns for describing an exemplary embodiment of a method of measuring a uniformity of an exposing light using the mask in FIG. 10A.

FIG. 10A is a plan view illustrating further still another exemplary embodiment of a mask according to the invention, and FIG. 10B is a plan view illustrating photoresist patterns for describing an exemplary embodiment of a method of measuring a uniformity of an exposing light using the mask 740 in FIG. 10A.

The exemplary embodiment of the mask 740 may be included in the previous exemplary embodiment of the exposure system 100 illustrated in FIG. 1, and the exposure system including the exemplary embodiment of the mask 740 is substantially the same as the exposure system 100 illustrated in FIG. 1 except for the mask 740. Thus, the same reference numerals will be used to refer to same or like parts as those described in the previous exemplary embodiment and any further repetitive explanation concerning the above elements will be omitted.

Referring to FIGS. 10A and 10B, the exemplary embodiment of the mask 740 includes a first mask portion 741, a second mask portion 742, a third mask portion 743 and a fourth mask portion 744. Each of the first, second, third and fourth mask portions 741, 742, 743 and 744 includes a light blocking portion 751 and a transmission portion 761. The transmission portion 761 includes a plurality of slits of which dimensions and/or profiles of respective sides are different from each other. The first, second, third and fourth masks 741, 742, 743 and 744 are substantially the same.

The first light L1 emitted from the first optical module 111 of the exposure apparatus 110 is transmitted through the first mask portion 741 to form a first photoresist pattern 681. The second light L2 emitted from the first and second optical module 111 and 112 of the exposure apparatus 110 is transmitted through the second and third mask portions 742 and 743 to form second and third photoresist patterns 682 and 683, and the third L3 emitted from the second optical module 112 of the exposure apparatus 110 is transmitted through the fourth mask portion 744 to form a fourth photoresist pattern 684. The first, second, third and fourth photoresist patterns 681, 682, 683 and 684 may be test patterns in a test area TA of a substrate 120 of a display panel for measuring the uniformity of the exposure by the exposure apparatus 110.

Specifically, each of the first, second, third and fourth photoresist patterns 681, 682, 683 and 684 may be formed by patterning a photoresist by using the light emitted from the exposure apparatus 110.

When the illuminances of the first, second and third lights L1, L2 and L3 are uniform, a first remaining portion 691 in which the photoresist remains in the first photoresist pattern 681, a second remaining portion 692 in which the photoresist remains in the second photoresist pattern 682, a third remaining portion 693 in which the photoresist remains in the third photoresist pattern 683 and a fourth remaining portion 694 in which the photoresist remains in the fourth photoresist pattern 684, have the same planar shapes.

However, when the illuminance of the second light L2 is higher than the illuminance of the first light L1 and the illuminance of the third light L3 is higher than the illuminance of the second light L2, the second and third remaining portions 692 and 693 may be smaller than the first remaining portion 691, and the fourth remaining portion 694 may be smaller than the second and third remaining portions 692 and 693.

In one or more exemplary embodiment, the uniformity of the exposure by the exposure apparatus 110 may be measured by noting the size or shape of the first, second, third and fourth remaining portions 691, 692, 693 and 694 respectively formed in the first, second, third and fourth photoresist patterns 681, 682, 683 and 684.

According to one or more exemplary embodiment of the method of measuring the uniformity of the exposing light and the exposure system performing the method of measuring the uniformity of the exposing light, the uniformity of the exposure by an exposure system may be measured, and thus when the uniformity of the exposure by the exposure apparatus is less than a predetermined reference, a process performed with respect to a substrate may be stopped to decrease a defect rate of a display panel including the substrate.

The foregoing is illustrative of the invention and is not to be construed as limiting thereof. Although a few exemplary embodiments of the invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific exemplary embodiments disclosed, and that modifications to the disclosed exemplary embodiments, as well as other exemplary embodiments, are intended to be included within the scope of the appended claims. The invention is defined by the following claims, with equivalents of the claims to be included therein.

What is claimed is:

1. An exposure system comprising:
   an exposure apparatus including a first module and a second module which overlap in a single scanning direction of the exposure apparatus by an overlapping area, wherein each of the first and second modules generates and emits a light;
   a mask including a plurality of transmission portions which are spaced apart from each other, each of the transmission portions having a width less than a width of the overlapping area, wherein the transmission portions transmit the light emitted by the first and second modules;
   a test pattern portion including a plurality of test patterns each of which comprises a metal pattern which is patterned by using the light which is transmitted through the transmission portions of the mask; and
   a uniformity measuring part which measures characteristics between test patterns in the test pattern portion to measure uniformity of the light from the first and second modules,
   wherein the metal pattern comprises:
   first and second conduction portions which face each other in a plan view of the metal pattern, wherein facing edges of the first and second conduction patterns form a concave shape in the plan view; and
   a concave portion at a central portion of the metal pattern and including the concave shape.

2. The exposure system of claim 1, wherein the uniformity measuring part comprises first and second probes which are connected to the metal pattern and measures electrical characteristics of the metal pattern.

3. The exposure system of claim 1, wherein the concave portion includes two of the concave shapes which face each other, and a distance between the two concave shapes is a width of the concave portion,
   the metal pattern comprises a plurality of the concave portions having widths different from each other.

4. The exposure system of claim 1, wherein the first probe is connected to the first conduction portion and the second probe is connected to the second conduction portion, and
   the connection of the first and second probes to the first and second conduction portions, respectively, tests electric connection between the first conduction portion and the second conduction portion.

5. The exposure system of claim 1, wherein the test pattern portion further comprises a conduction bar electrically connecting a plurality of the first conduction portions to each other.

6. The exposure system of claim 2, wherein
   the first probe is connected to a first terminal of the test pattern and the second probe is connected to a second terminal of the test pattern, and
   the connection of the first and second probes to the first and second terminals of the test pattern, respectively, measures a resistance of the test pattern.

7. The exposure system of claim 6, wherein each of the test patterns includes a plurality of bends along a longitudinal axis of the test pattern.

8. The exposure system of claim 1, wherein each of the test patterns is a photoresist pattern which is patterned by using the light emitted by the first and second modules.

9. The exposure system of claim 8, wherein the uniformity measuring part comprises a thickness measuring part which measures a thickness of the photoresist pattern.

10. The exposure system of claim 1, wherein each of the transmission portions of the mask comprises a slit.

11. The exposure system of claim 1, wherein each of the transmission portions of the mask comprises a half tone film.

12. The exposure system of claim 1, wherein each of the transmission portions of the mask comprises slits having sizes different from each other.

13. The exposure system of claim 1, wherein the test pattern portion is at an edge portion of a substrate which is scanned by the exposure apparatus.

14. A method of measuring a uniformity of exposing light, the method comprising:
   disposing a mask under first and second modules which emit a light, wherein
   the first and second modules overlap in a single scanning direction of the exposure apparatus by an overlapping area, and
   the mask includes a plurality of transmission portions which transmit the light and are spaced apart from each other, each of the transmission portions having a width less than a width of the overlapping area;
   transmitting the light through the transmission portions to form a test pattern portion including a plurality of test patterns,
   each of the test patterns comprising a metal pattern which is patterned by using the light, the metal pattern comprising:
   first and second conduction portions which face each other in a plan view of the metal pattern, wherein facing edges of the first and second conduction patterns form a concave shape in the plan view; and
   a concave portion at a central portion of the metal pattern and including the concave shape; and measuring characteristics between the test patterns of the test pattern portion to measure the uniformity of the exposing light.

15. The method of claim 14, wherein
the measuring the uniformity of the test patterns comprises connecting a first probe to the first conduction portion and a second probe to the second portion, wherein the connecting the first and second probes to the first and second conduction portions, respectively, tests electric connection between the first and second conduction portions.

16. The method of claim 14, wherein
the measuring the uniformity of the test patterns comprises connecting a first probe to a first terminal of the test pattern and a second probe to a second terminal of the test pattern, wherein the connecting the first and second probes to the first and second terminals, respectively, measures a resistance of the metal pattern.

* * * * *